United States Patent
Lee et al.

(10) Patent No.: US 8,227,795 B2
(45) Date of Patent: Jul. 24, 2012

(54) ORGANIC THIN FILM TRANSISTOR, FLAT PANEL DISPLAY APPARATUS HAVING THE SAME, AND A METHOD OF MANUFACTURING ORGANIC THIN FILM TRANSISTOR

(75) Inventors: Sang-Min Lee, Suwon-si (KR); Min-chul Suh, Suwon-si (KR); Yong-Woo Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 586 days.

(21) Appl. No.: 11/594,903

(22) Filed: Nov. 9, 2006

(65) Prior Publication Data
US 2007/0102699 A1    May 10, 2007

(30) Foreign Application Priority Data
Nov. 10, 2005  (KR) .................. 10-2005-0107607

(51) Int. Cl.
*H01L 29/08*    (2006.01)
(52) U.S. Cl. .............. 257/40; 257/59; 257/72; 257/347; 257/E51.005; 257/E51.006
(58) Field of Classification Search .............. 257/40, 257/59, 72, 347, E51.005, E51.006
See application file for complete search history.

(56) References Cited

U.S. PATENT DOCUMENTS

| | | | | |
|---|---|---|---|---|
| 6,828,582 | B1 * | 12/2004 | Ando et al. ................ | 257/40 |
| 2002/0045289 | A1 * | 4/2002 | Dimitrakopoulos et al. ... | 438/99 |
| 2004/0161873 | A1 * | 8/2004 | Dimitrakopoulos et al. ... | 438/99 |
| 2005/0176185 | A1 * | 8/2005 | Jang et al. .................. | 438/155 |
| 2005/0274954 | A1 * | 12/2005 | Tanaka et al. ............... | 257/72 |

FOREIGN PATENT DOCUMENTS

| | | |
|---|---|---|
| KR | 2004-57510 | 7/2004 |
| KR | 2004-12212 | 11/2004 |
| KR | 2005-4565 | 1/2005 |
| KR | 2005-80503 | 8/2005 |

OTHER PUBLICATIONS

U.S. Appl. No. 11/582,467, filed Oct. 2006, Park et al., Samsung SDI Co., Ltd.
U.S. Appl. No. 11/582,534, filed Oct. 2006, Ahn et al., Samsung SDI Co., Ltd.
Office Action issued in Korean Patent Application No. 2005-107607 on Nov. 17, 2006.

* cited by examiner

*Primary Examiner* — Minh-Loan T Tran
*Assistant Examiner* — Fazli Erdem
(74) *Attorney, Agent, or Firm* — H.C. Park & Associates, PLC

(57) ABSTRACT

An organic thin film transistor (TFT) that allows an organic semiconductor layer to be easily patterned includes a gate electrode, source and drain electrodes insulated from the gate electrode, a self-assembly monolayer formed on the source and drain electrodes, an organic semiconductor layer which is insulated from the gate electrode and covers at least a portion of the self-assembly monolayer. A flat panel display apparatus includes the organic TFT. A method of manufacturing an organic TFT includes forming source and drain electrodes on a substrate; forming a self-assembly monolayer covering at least the source and drain electrodes; patterning the self-assembly monolayer to remove portions of the self-assembly monolayer that are not located on the source and drain electrodes; and forming an organic semiconductor layer by inkjet printing an organic semiconductor material between the source and drain electrodes.

15 Claims, 5 Drawing Sheets

ORGANIC THIN FILM TRANSISTOR, FLAT PANEL DISPLAY APPARATUS HAVING THE SAME, AND A METHOD OF MANUFACTURING ORGANIC THIN FILM TRANSISTOR

CROSS-REFERENCE TO RELATED APPLICATIONS

This application claims the benefit of Korean Application No. 2005-107607, filed Nov. 10, 2005, in the Korean Intellectual Property Office, the disclosure of which is incorporated herein by reference.

BACKGROUND OF THE INVENTION

1. Field of the Invention

Aspects of the present invention relate to an organic thin film transistor (organic TFT), a flat panel display apparatus having the organic TFT, and a method of manufacturing the organic TFT. More particularly, aspects of the present invention relate to an organic TFT from which a patterning effect of an organic semiconductor layer can be obtained, a flat panel display apparatus having the organic TFT, and a method of manufacturing the organic TFT.

2. Description of the Related Art

TFTs are used in flat panel display apparatuses such as liquid crystal display devices, organic electroluminescent display devices, and inorganic electroluminescent display devices. In such devices, TFTs may be used as switching devices that control the operation of pixels and as operating devices that operates the pixels.

A TFT includes a semiconductor layer having source and drain regions and a channel region, a gate electrode insulated from the semiconductor layer and located in a region corresponding to the channel region, and source and drain electrodes respectively contacting the source and drain regions.

Recently, it has become desirable for flat panel display apparatuses to have slimness and flexibility.

To achieve flexibility in display devices, many attempts have been made to use plastic substrates instead of conventional glass substrates. When a plastic substrate is used, high temperature processing cannot be used but instead, low temperature processing is required. Accordingly, conventional silicon TFTs, which require high temperature processes for their formation, cannot be formed on plastic substrates.

To address this problem, organic semiconductors ithat can be processed at low temperatures have been developed, and thus, low cost TFTs on flexible substrates can be realized.

However, to form an active channel of a TFT, patterning is required, and organic semiconductors cannot be patterned using conventional patterning methods such as photolithography. When the organic semiconductor is patterned using a conventional etching method in which wet and dry etching processes are mixed, the organic semiconductor can be damaged.

On the other hand, if the organic semiconductor layer of a TFT is not patterned, the organic semiconductor layer can cause cross-talk with electronic components such as adjacent wires, other TFTs, or capacitors, resulting in a leakage current and reducing the device characteristics.

Accordingly, there is a need to develop a new method of patterning organic semiconductors.

SUMMARY OF THE INVENTION

Aspects of the present invention provide an organic TFT in which an organic semiconductor can be easily patterned, a flat panel display apparatus having the organic TFT, and a method of manufacturing the organic TFT.

According to an aspect of the present invention, there is provided an organic TFT (thin film transistor) comprising: a gate electrode; source and drain electrodes insulated from the gate electrode; a self-assembly monolayer formed on the source and drain electrodes; and an organic semiconductor layer which is insulated from the gate electrode and covers at least a portion of the self-assembly monolayer.

According to an aspect of the present invention, there is provided a flat panel display apparatus comprising: an organic TFT that comprises a gate electrode, source and drain electrodes insulated from the gate electrode, a self-assembly monolayer formed on the source and drain electrodes, and an organic semiconductor layer which is insulated from the gate electrode and covers at least a portion of the self-assembly monolayer; and a pixel electrode electrically connected to one of the source and drain electrodes of the organic TFT.

According to an aspect of the present invention, there is provided a method of manufacturing an organic TFT comprising: forming source and drain electrodes on a substrate; forming a self-assembly monolayer covering the source and drain electrodes; patterning the self-assembly monolayer so that the self-assembly monolayer is located on the source and drain electrodes; and forming an organic semiconductor layer by inkjet printing an organic semiconductor material between the source and drain electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
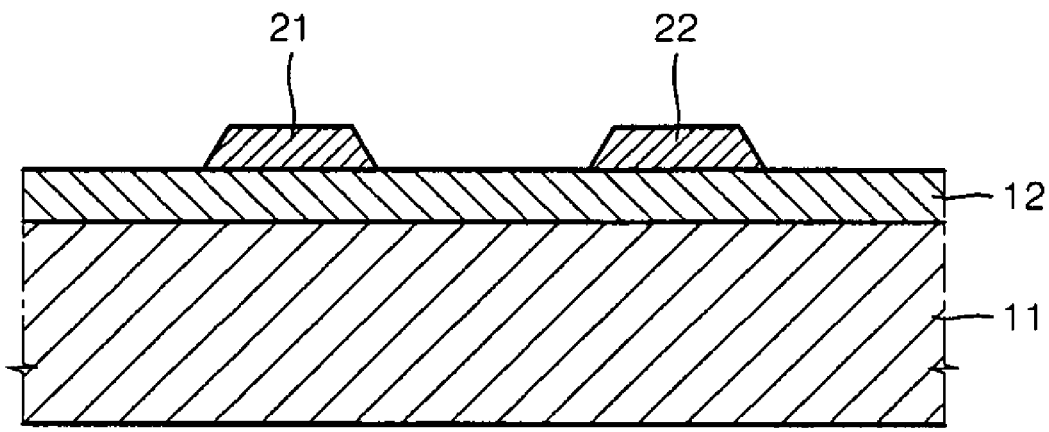
FIGS. 1A through 1G are cross-sectional views illustrating a method of manufacturing an organic TFT according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

A method of manufacturing an organic TFT according to an embodiment of the present invention will now be described, referring to FIGS. 1A through 1G, which are cross-sectional views illustrating the method.

Referring to FIG. 1A, a source electrode 21 and a drain electrode 22 are formed on a substrate 11. The substrate 11 can be formed of a plastic material such as acryl, polyimide, polycarbonate, polyester, or mylar, but the present invention is not limited thereto. That is, the substrate 11 can be formed of any suitable material such as a plastic material, metal foil such as SUS or tungsten, or a glass material. The substrate 11 may be a flexible substrate.

An insulating layer 12 such as a barrier layer and/or a buffer layer for preventing the diffusion of impurity ions, for preventing the penetration of moisture or external air, and for planarizing a surface of the substrate 11 can be formed on an upper surface of the substrate 11.

The source and drain electrodes 21 and 22 can be formed of a metal such as Al, Mo, Au, Ag, Pt/Pd, or Cu, but the present invention is not limited thereto. The source and drain electrodes 21 and 22 can be formed by coating a resin paste containing a powder of the above metals, or can be formed using a conductive polymer.

The source and drain electrodes 21 and 22 can be formed in a predetermined pattern on the insulating layer 12.

Figure 1B:
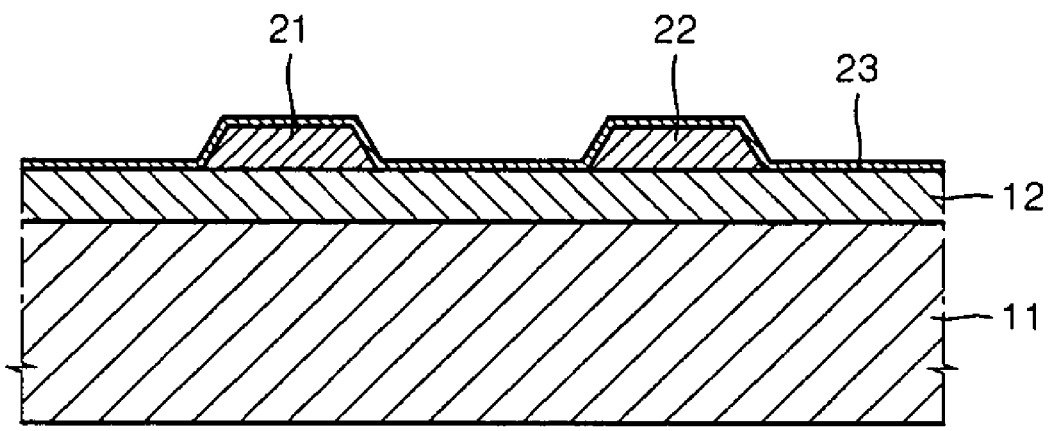

Next, referring to FIG. 1B, a self-assembly monolayer 23 covering the source and drain electrodes 21 and 22 is formed. The self-assembly monolayer 23 may be formed to have a hydrophobic property, or even an extreme hydrophobic property, and can be formed using a surface treatment agent having a particular structure.

The surface treatment agent for forming the self-assembly monolayer 23 having an extreme hydrophobic property can be octadecyltrichlorosilane (OTS), fluorinated trichloro silane, or an organic molecule having a $X—CH_3(CH_2)_y Si(OR^1)_u R^2_v$ structure wherein X is an amino radical, a thiol radical, or an alkyl fluorinated radical, y ranges from 1 to 20, u ranges from 1 to 2, v ranges from 1 to 2 and $R^1$ and $R^2$ are independently hydrogen; halogen; an unsubstituted or substituted $C_1$-$C_{20}$ alkyl group; or an unsubstituted or substituted $C_6$-$C_{30}$ aryl group.

The self-assembly monolayer 23 is formed on the insulating layer 12 to cover the source and drain electrodes 21 and 22. As shown in FIG. 1B, the self-assembly monolayer when initially formed may also cover the portions of the substrate other than where the source and drain electrodes are formed.

Figure 1C:
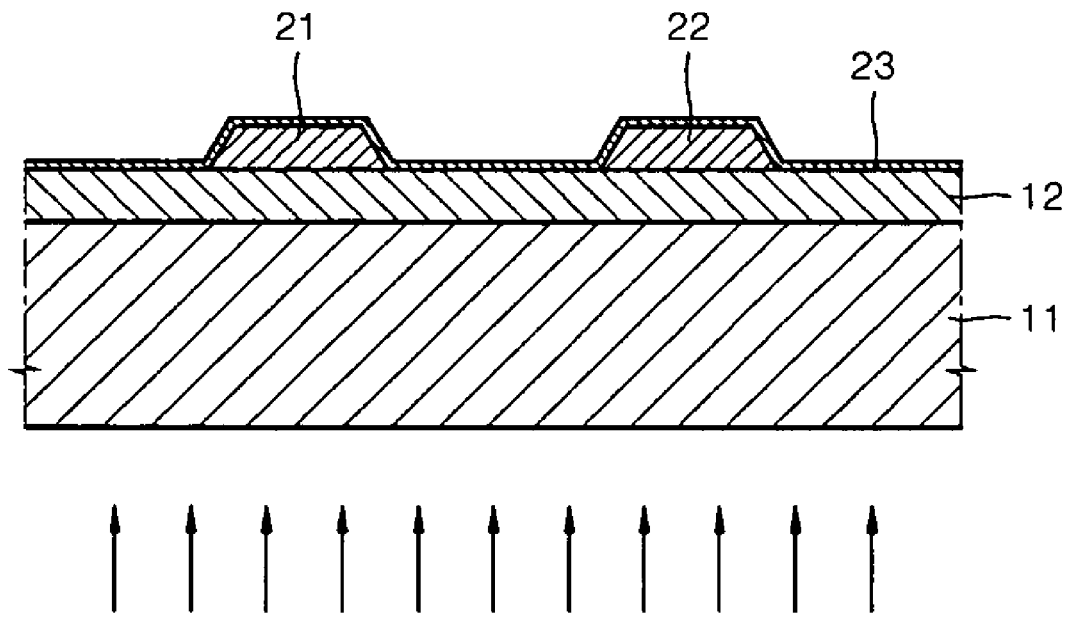
Figure 1D:
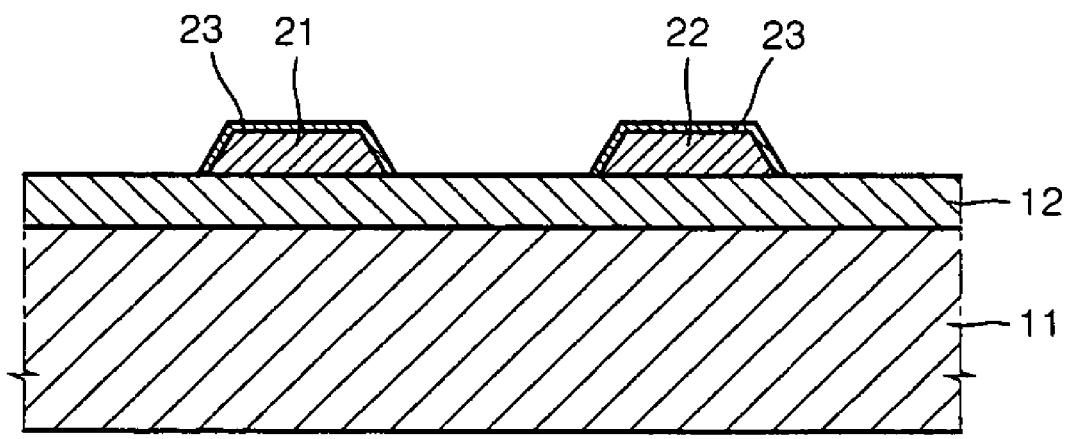

Referring to FIG. 1C, after the self-assembly monolayer 23 is formed, the resultant product is exposed by irradiating ultraviolet rays from the rear side of the substrate 11 (that is, from the side of the substrate 11 opposite from the side on which the source and drain electrodes 21 and 22 are formed, and is thereby developed. That is, the self-assembly monolayer is removed or eliminated in portions of the substrate that are irradiated by ultraviolet rays. The source and drain electrodes 21 and 22 function as masks so that the portions of the self-assembly monolayer that cover the source and drain electrodes 21 and 22 are not irradiated. As a result, as depicted in FIG. 1D, the self-assembly monolayer 23 remains only on the source and drain electrodes 21 and 22.

Figure 1E:
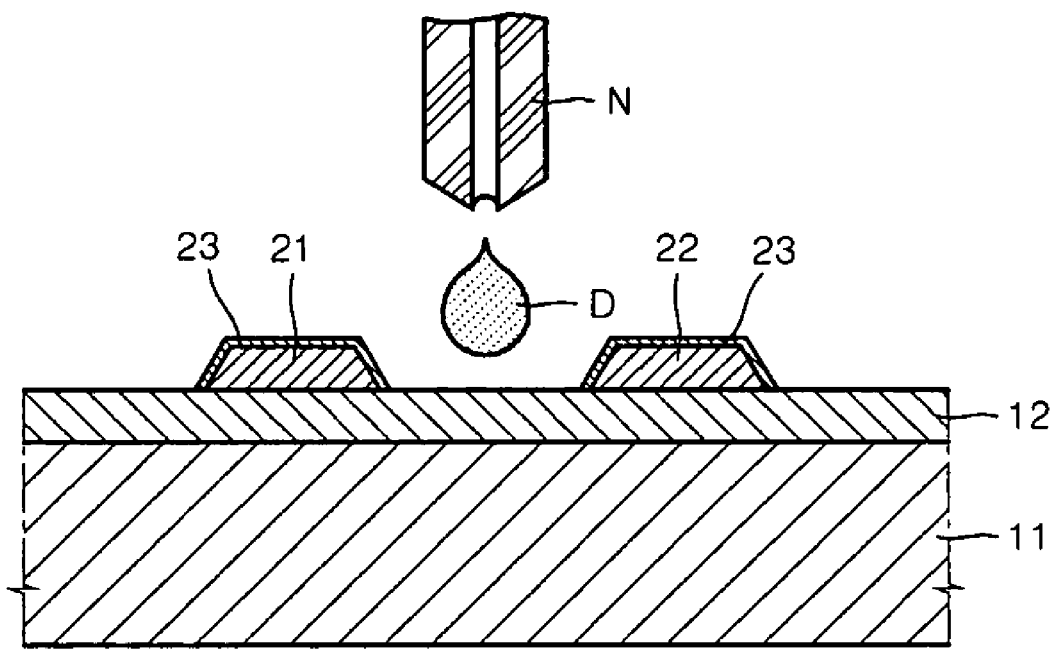

Referring to FIG. 1E, after the self-assembly monolayer 23 having a hydrophobic property is formed so that the monolayer remains only on the source and drain electrodes 21 and 22, an organic semiconductor layer 24 is formed by dropping an organic semiconductor drop D between the source and drain electrodes 21 and 22 using an inkjet nozzle N.

Since the self-assembly monolayer 23 is formed on the source and drain electrodes 21 and 22, the source and drain electrodes 21 and 22 are not overflowed by the organic semiconductor drop D when it falls between the source and drain electrodes 21 and 22. That is, the source and drain electrodes 21 and 22 function as dams for the organic semiconductor drop D. The self-assembly monolayer 23 on the source and drain electrodes 21 and 22 facilitates the patterning of the organic semiconductor drop D on a desired position by preventing the organic semiconductor drop D from flowing beyond the source and drain electrodes 21 and 22.

Figure 1F:
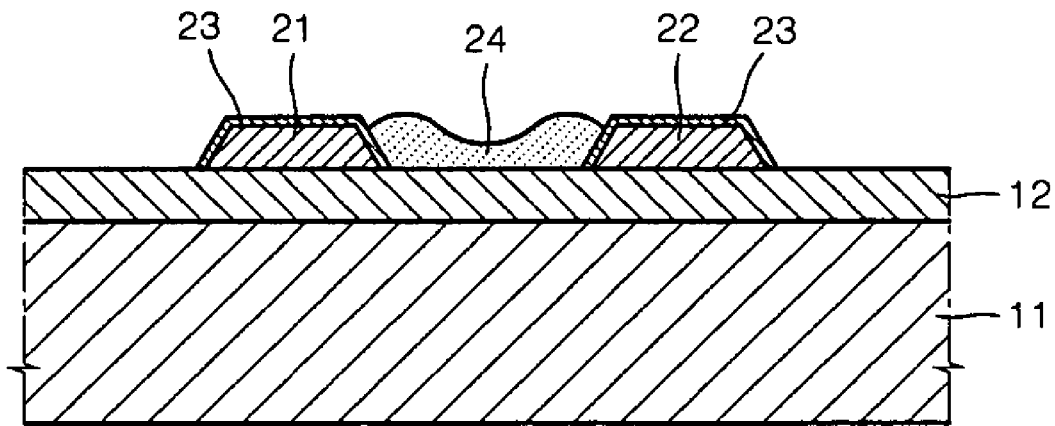

Referring to FIG. 1F, after the organic semiconductor drop D is formed to a desired pattern using inkjet printing, the resultant product is baked, thereby forming the organic semiconductor layer 24 between the source and drain electrodes 21 and 22.

The organic semiconductor material for forming the organic semiconductor layer 24 can be pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, an oligoacene of naphthalene and its derivatives, alpha-5-thiophene oligothiophene and its derivatives, phthalocyanine that includes or does not include a metal and its derivatives, naphthalene tetracarboxylic diimide and its derivatives, naphthalene tetracarboxylic dianhydride and its derivatives, pyromelliticdianhydride and its derivatives, pyromellitic diimide and its derivatives, a conjugate polymer that includes thiophene and its derivatives, or a polymer that includes fluorene and its derivatives.

Figure 1G:
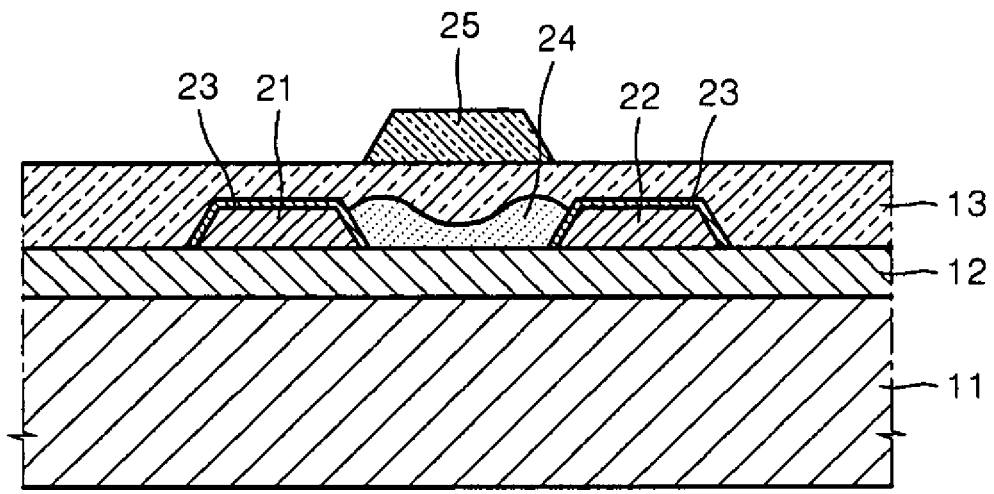

Referring to FIG. 1G, after the organic semiconductor layer 24 is formed, a gate insulating film 13 covering the source and drain electrodes 21 and 22 and the organic semiconductor layer 24 is formed. Afterwards, a gate electrode 25 is formed on the gate insulating film 13.

In the case of a flexible electronic device, the gate insulating film 13 may be formed to include an organic film formed by an ink.

The gate electrode 25 can be formed of a metal such as that used for the source and drain electrodes 21 and 22, but the present invention is not limited thereto. For example, the gate electrode 25 can be formed of a resin paste containing a metal powder of a conductive polymer.

In the present embodiment, the organic semiconductor layer 24 can be patterned by a simple process using the self-assembly monolayer 23 having a hydrophobic property to guide the positioning of the organic semiconductor layer 24. At the same time, the self-assembly monolayer 23 is disposed between the source and drain electrodes 21 and 22 and the organic semiconductor layer 24. Therefore, a contact resistance problem between the source and drain electrodes 21 and 22 and the organic semiconductor layer 24 can be prevented.

Figure 2:
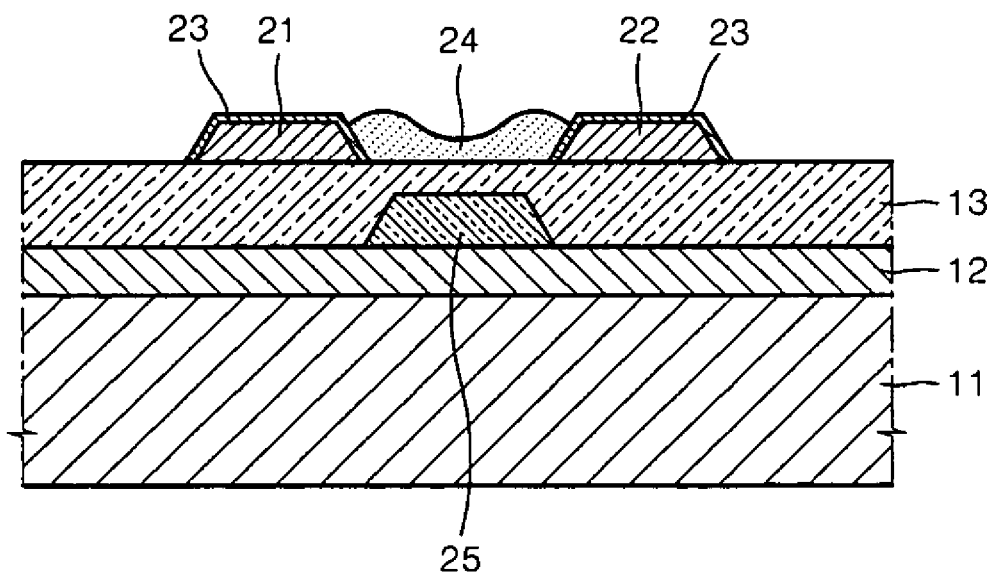
FIG. 2 is a cross-sectional view illustrating an organic TFT according to another embodiment of the present invention.

FIG. 2 is a cross-sectional view illustrating an organic TFT having a bottom gate type structure according to another embodiment of the present invention. Referring to FIG. 2, a gate electrode 25 is formed on an insulating layer 12 on a substrate 11, and a gate insulating film 13 covering the gate electrode 25 is formed. Afterwards, source and drain electrodes 21 and 22 are formed on the gate insulating film 13.

Next, a self-assembly monolayer 23 is formed on the source and drain electrodes 21 and 22, and an organic semiconductor layer 24 is formed between the source and drain electrodes 21 and 22.

Figure 3:
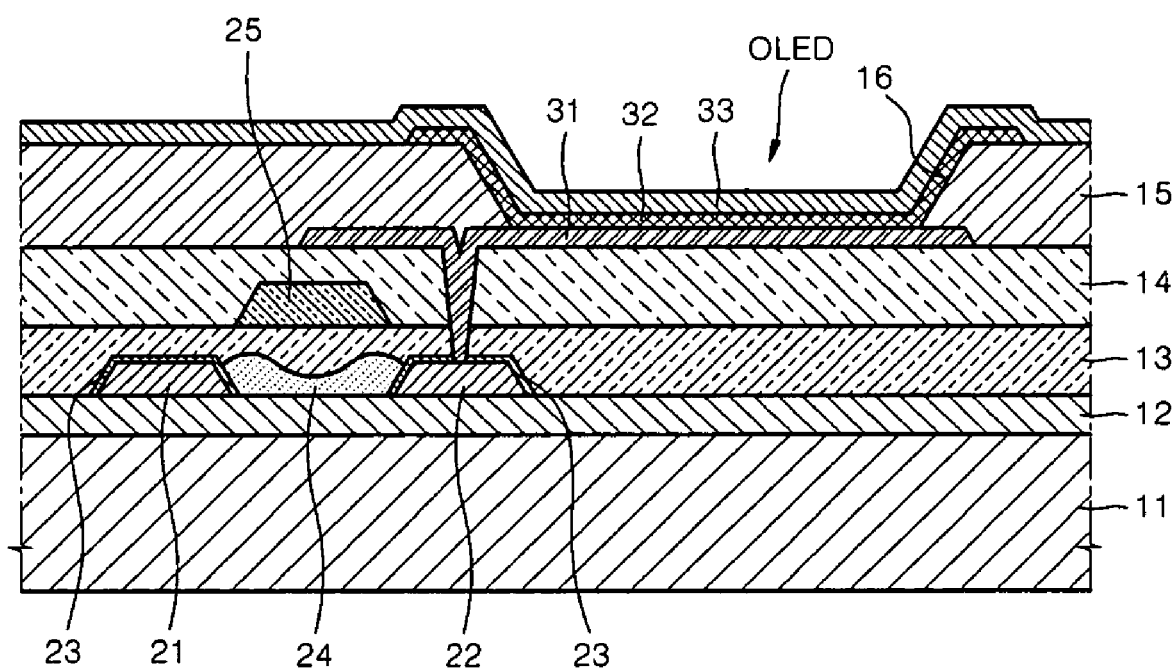
FIG. 3 is a cross-sectional view illustrating a flat panel display apparatus having the organic TFT of FIG. 1G according to an embodiment of the present invention.

An organic TFT having the structures of FIG. 1 or FIG. 2, or variations thereof, can be employed in flat panel display apparatuses such as an LCD or an organic electroluminescent display device. For example, an organic light emitting display apparatus may include various pixel patterns according to emitting colors of the OLED, and may include red R, green G, and blue B color sub-pixels. Each red R, green G, and blue B color sub-pixel respectively includes an organic TFT structure and an OLED as an emissive device as depicted in FIG. 3. The organic TFT can be the same as the TFT according to aspects described herein, but the TFT is not limited thereto, and can include various TFT structures.

FIG. 3 is a cross-sectional view of one sub-pixel of an organic light emitting display apparatus, in which the organic TFT having the configuration shown in FIG. 1G is employed. The sub-pixel includes an organic light emitting diode (OLED) as an emissive device and at least one TFT. As depicted in FIG. 3, source and drain electrodes 21 and 22 having a predetermined pattern are formed on an insulating layer 12 on a substrate 11, and a self-assembly monolayer 23 covering the source and drain electrodes 21 and 22 is formed. Afterwards, an organic semiconductor layer 24 is formed on the insulating layer 12 and on the self-assembly monolayer 23 between the source and drain electrodes 21 and 22. Next, a gate insulating film 13 covering the resultant product is formed, and a gate electrode 25 is formed on the gate insulating film 13.

Next, a passivation film 14 covering the gate electrode 25 and the gate insulating film 13 is formed. The passivation film 14 can be formed in a mono layer or multiple layers using an organic material, an inorganic material, or a composite of the organic and inorganic materials.

A pixel electrode 31 as an electrode of an OLED is formed on the passivation film 14 and is connected to one of the source and drain electrodes 21 and 22. A pixel defining film 15 is formed on the pixel electrode 31 and an organic light emitting film 32 of the OLED is formed after a predetermined opening 16 is formed in the pixel defining film 15. A facing electrode 33 is formed to cover the entire sub-pixel.

The OLED emits red R, green G, or blue B light in response to current flow, according to the selection of the organic light emitting film.

The pixel electrode 31 and the facing electrode 33 are insulated from each other by the organic light emitting film 32, and apply voltages having different polarities to the organic light emitting film 32 so that the organic light emitting film 32 can emit light.

The organic light emitting film 32 can be a low molecular weight organic film or a polymer organic film. If the organic light emitting film 32 is a low molecular weight organic film, the organic light emitting film 32 can be formed by stacking a hole injection layer (HIL), a hole transport layer (HTL), an emission layer (EML), an electron transport layer (ETL), or an electron injection layer (EIL) to form a single structure or a composite structure, and can be composed of copper phthalocyanine (CuPc), N,N'-di(naphthalene-1-yl)-N,N'-diphenyl-benzidine (NPB), or tris-8-hydroxyquinoline aluminum ($Alq_3$). The low molecular weight organic film can be formed using a vacuum evaporation method.

If the organic light emitting film 32 is a polymer organic film, the organic light emitting film 32 can have a structure in which an HTL and an EML are included. The HTL can be formed of poly-(2,4)-ethylene-dihydroxy thiophene (PEDOT) and the EML can be formed of poly-phenylenevinylene (PPV) or polyfluorene. The organic light emitting film 32 can be formed using screen printing or inkjet printing.

The organic film is not limited thereto, and can include various modifications.

The pixel electrode 31 may function as an anode electrode, and the facing electrode 33 may function as a cathode electrode, but the polarity of the pixel electrode 31 and the facing electrode 33 can be reversed.

The present invention is not limited to the above structure, and various structures of organic light emitting display apparatuses can be employed. For example, a capacitor (not shown) can be further included.

If a flat panel display apparatus is a liquid crystal display, the manufacturing method differs from that described above in that the manufacture of the lower substrate of the liquid crystal display apparatus is completed by forming a lower orientation film (not shown) covering a pixel electrode.

A TFT according to an embodiment of the present invention can be mounted in each sub-pixel, in a driver circuit (not shown), or in other electronic circuits.

According to aspects of the present invention, an organic semiconductor layer can be easily patterned using an inkjet printing method. Therefore, cross-talk between adjacent electronic devices can be reduced, and thus, a leakage current can be reduced.

Also, according to aspects of the present invention, contact resistance between an organic semiconductor layer and source and drain electrodes can be reduced by forming a self-assembly monolayer between the organic semiconductor layer and the source and drain electrodes.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic thin film transistor (TFT) comprising:
a gate electrode;
source and drain electrodes insulated from the gate electrode;
a self-assembly monolayer formed only on the source and drain electrodes; and
an organic semiconductor layer that is insulated from the gate electrode and is disposed between the source and drain electrodes, wherein,
the entire organic semiconductor layer is formed on a region defined between the source and drain electrodes, and
at least the top surface of the self-assembly monolayer is hydrophobic.

2. The organic TFT of claim 1, further comprising a substrate and wherein the source and drain electrodes are formed on the substrate.

3. The organic TFT of claim 1, further comprising a substrate and an insulating layer covering the substrate and wherein the source and drain electrodes are formed on the insulating layer.

4. The organic TFT of claim 1, further comprising a substrate and a gate insulating film, wherein the gate electrode is formed on the substrate and the gate insulating film is formed covering the gate electrode,
the source and drain electrodes are formed on the gate insulating film, and
the organic semiconductor layer is disposed on the gate insulating film between the source and drain electrodes.

5. The organic TFT of claim 1, wherein the self-assembly monolayer has a hydrophobic property.

6. The organic TFT of claim 1, wherein the organic semiconductor layer is formed of a material that comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, an oligoacene of naphthalene and its derivatives, an alpha-5-thiophene oligothiophene and its derivatives, phthalocyanine that includes or does not include a metal and its derivatives, naphthalene tetracarboxylic diimide and its derivatives, naphthalene tetracarboxylic dianhydride and its derivatives, pyromelliticdianhydride and its derivatives, pyromellitic diimide and its derivatives, a conjugate polymer that includes thiophene and its derivatives, and a polymer that includes fluorene and its derivatives.

7. The organic TFT of claim 1, wherein the organic semiconductor layer contacts the self-assembly monolayer on the source and drain electrodes such that the self-assembly monolayer reduces contact resistance between the organic semiconductor layer and the source and drain electrodes.

8. A flat panel display apparatus comprising:
   an organic TFT that comprises a gate electrode, source and drain electrodes insulated from the gate electrode, a self-assembly monolayer formed only on the source and drain electrodes, and an organic semiconductor layer which is insulated from the gate electrode and is disposed between the source and drain electrodes; and
   a pixel electrode electrically connected to one of the source and drain electrodes of the organic TFT, wherein
   the entire organic semiconductor layer is formed on a region defined between the source and drain electrodes, and
   at least the top surface of the self-assembly monolayer is hydrophobic.

9. The flat panel display apparatus of claim 8, wherein the organic TFT further comprises a substrate and wherein the source and drain electrodes are formed on a substrate.

10. The flat panel display apparatus of claim 8, wherein the organic TFT further comprises a substrate and an insulating layer covering the substrate and wherein the source and drain electrodes are formed on the insulating layer.

11. The flat panel display apparatus of claim 8, further comprising a substrate and a gate insulating film, wherein the gate electrode is formed on the substrate and the gate insulating film is formed covering the gate electrode,
   the source and drain electrodes are formed on the gate insulating film, and
   the organic semiconductor layer is disposed on the gate insulating film between the source and drain electrodes.

12. The flat panel display apparatus of claim 8, wherein the self-assembly monolayer has a hydrophobic property.

13. The flat panel display apparatus of claim 8, wherein the organic semiconductor layer is formed of a material that comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, an oligoacene of naphthalene and its derivatives, an alpha-5-thiophene oligothiophene and its derivatives, phthalocyanine that includes or does not include a metal and its derivatives, naphthalene tetracarboxylic diimide and its derivatives, naphthalene tetracarboxylic dianhydride and its derivatives, pyromelliticdianhydride and its derivatives, pyromellitic diimide and its derivatives, a conjugate polymer that includes thiophene and its derivatives, and a polymer that includes fluorene and its derivatives.

14. The flat panel display apparatus of claim 8, wherein the pixel electrode electrically connects the organic TFT to an organic light emitting diode (OLED).

15. The flat panel display apparatus of claim 8, wherein the pixel electrode electrically connects the organic TFT to a liquid crystal display (LCD).

\* \* \* \* \*